US006600686B2

(12) United States Patent
Huh et al.

(10) Patent No.: US 6,600,686 B2
(45) Date of Patent: Jul. 29, 2003

(54) APPARATUS FOR RECOGNIZING CHIP IDENTIFICATION AND SEMICONDUCTOR DEVICE COMPRISING THE APPARATUS

(75) Inventors: Boo-young Huh, Suwon (KR); Won-chul Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/055,209

(22) Filed: Jan. 23, 2002

(65) Prior Publication Data

US 2002/0105854 A1 Aug. 8, 2002

(30) Foreign Application Priority Data

Feb. 7, 2001 (KR) .......................................... 2001-5947

(51) Int. Cl.$^7$ ........................ G11C 16/20; H01L 21/66; G01R 31/28
(52) U.S. Cl. ................. 365/201; 365/236; 365/230.06; 365/225.7; 365/189.02; 365/189.03; 365/239; 365/51; 365/63; 257/48; 438/18; 438/17; 714/732; 716/4
(58) Field of Search ................................ 365/201, 236, 365/191, 230.06, 225.7, 189.12, 189.02, 189.03, 230.02, 239, 240, 51, 63; 257/48; 438/17, 18; 714/732; 716/4

(56) References Cited

U.S. PATENT DOCUMENTS

| 4,150,331 A | * | 4/1979 | Lacher | 324/537 |
|---|---|---|---|---|
| 4,419,747 A | * | 12/1983 | Jordan | 365/201 |
| 4,510,673 A | * | 4/1985 | Shils et al. | 438/15 |
| 5,051,374 A | * | 9/1991 | Kagawa et al. | 438/449 |
| 5,056,061 A | * | 10/1991 | Akylas et al. | 365/96 |
| 5,079,725 A | * | 1/1992 | Geer et al. | 714/726 |
| 5,294,812 A | | 3/1994 | Hashimoto et al. | 257/65 |
| 5,350,715 A | * | 9/1994 | Lee | 438/16 |
| 5,642,307 A | * | 6/1997 | Jernigan | 365/103 |
| 6,161,213 A | * | 12/2000 | Lofstrom | 716/4 |
| 6,408,410 B1 | * | 6/2002 | Needham | 714/724 |

FOREIGN PATENT DOCUMENTS

| EP | 1170754 | 1/2002 | ........... G11C/16/20 |
|---|---|---|---|
| GB | 2244339 | 11/1991 | ........... G01R/31/28 |
| JP | 11-121566 | 4/1999 | ........... H01L/21/66 |
| JP | 11121566 | 4/1999 | ........... H01L/21/66 |

OTHER PUBLICATIONS

Search Report dated Aug. 9, 2002.

* cited by examiner

*Primary Examiner*—Andrew Q. Tran
(74) *Attorney, Agent, or Firm*—F.Chau & Associates, LLP

(57) ABSTRACT

A semiconductor device having an apparatus is provided for recognizing chip identification capable of minimizing the number of pads. The apparatus for recognizing chip identification comprises a counter circuit for counting a clock signal in response to a reset signal and decoding the counted clock signal to produce at least one decoding signal; and a fuse circuit comprising a plurality of fuse arrays, each fuse of the plurality of fuse arrays representing chip identification information, for outputting an output signal indicating whether each fuse of the plurality of fuse arrays is cut in response to the at least one decoding signal. The apparatus for recognizing chip identification minimizes the number of pads required for a semiconductor chip, occupies a small portion of a semiconductor device, and reads chip information in a package state of a semiconductor device.

14 Claims, 8 Drawing Sheets

FIG. 8

| C0 | CLK | A3 | A2 | A1 | A0 |
|----|-----|----|----|----|----|
| 0  | 0   | L  | L  | L  | H  |
| 0  | 1   | L  | L  | H  | L  |
| 1  | 0   | L  | H  | L  | L  |
| 1  | 1   | H  | L  | L  | L  |

FIG. 9

| C3 | C2 | C1 | B7 | B6 | B5 | B4 | B3 | B2 | B1 | B0 |
|----|----|----|----|----|----|----|----|----|----|----|
| 0  | 0  | 0  | L  | L  | L  | L  | L  | L  | L  | H  |
| 0  | 0  | 1  | L  | L  | L  | L  | L  | L  | H  | L  |
| 0  | 1  | 0  | L  | L  | L  | L  | L  | H  | L  | L  |
| 0  | 1  | 1  | L  | L  | L  | L  | H  | L  | L  | L  |
| 1  | 0  | 0  | L  | L  | L  | H  | L  | L  | L  | L  |
| 1  | 0  | 1  | L  | L  | H  | L  | L  | L  | L  | L  |
| 1  | 1  | 0  | L  | H  | L  | L  | L  | L  | L  | L  |
| 1  | 1  | 1  | H  | L  | L  | L  | L  | L  | L  | L  |

US 6,600,686 B2

APPARATUS FOR RECOGNIZING CHIP IDENTIFICATION AND SEMICONDUCTOR DEVICE COMPRISING THE APPARATUS

BACKGROUND

1. Technical Field

The present invention relates to a semiconductor device, and more particularly, to a semiconductor device having an apparatus for recognizing chip identification.

2. Description of Related Art

In the manufacture of semiconductor devices, semiconductor chips are formed on a wafer and a test is usually performed with the semiconductor chips on the wafer to verify that operations of semiconductor chips work properly. If the semiconductor device properly operates, it is packaged through an assembly process and then, a test is performed on the packaged device to determine if the packaged device works properly. If it does, the device can be put on the market for sale. Device and test identification information (so called "chip ID") such as process lot number, wafer number and chip position on the wafer are put on the semiconductor device. When a defective device is later found, whether from device failure or caused by improper handling by users, the chip ID information can be used to aid in determining the cause of the defect. But the "chip ID" cannot be read from a packaged semiconductor device. Accordingly, it is often difficult if not impossible to determine whether defects are caused by a random event or caused by certain processes after packaging of a semiconductor device. Without knowing the cause of the defect, it is difficult to reduce the rate of defect.

FIG. 1 shows a chip ID recognition apparatus as disclosed in U.S. Pat. No. 5,294,812. Referring to FIG. 1, a conventional chip ID recognition apparatus comprises a resistor R11, NMOS transistors MN10 through MN1$n$ and fuses F10 through F1$n$. Each gate of the NMOS transistors MN10 through MN1$n$ is connected to a control signal CON. The fuses are cut by a laser beam according to specifications before an assembly process, and after passing a wafer test. Thus, a power voltage VDD is not transmitted to cut fuses, but to uncut fuses through I/O terminals I/O0 through I/O$n$. If all the fuses F10 through F1$n$ are not cut, the power voltage VDD is connected through transistors MN10 to MN1$n$ to I/O0 to I/O$n$. In contrast, if all the fuses F10 through F1$n$ are cut, the power voltage VDD is cut-off from I/O0 to I/O$n$. The amount of information of chip ID presentable by such circuit depends on the number of cut fuses. For example, when the number of fuses is n, $2^n$ pieces of information can be presented.

FIG. 2 is a diagram illustrating the arrangement of pads of a conventional semiconductor device incorporating the chip ID recognition apparatus shown in FIG. 1. Reference numerals 21 through 2$n$ denote pads connected to the I/O terminals I/O0 through I/O$n$. The conventional semiconductor device requires a plurality of pads for reading information on whether each fuse is cut or not. A circuit for ID recognition placed within a chip requires a greater number of pads for a number of external connection, while it occupies a smaller space due to a fine line width of a circuit in a semiconductor device. The increase in the number of pads may cause the increase of the chip size. Further, the information on chip ID comprises a wafer number and the characteristics of a chip as well as a chip position on a wafer. Therefore, the number of pads increases according to the increase of the number of pieces of information.

Also, the pads 21 through 2$n$ are connected to an external electrode via a package pin. If there is a potential difference between any of the pads 21 through 2$n$ and the external electrode, power is unnecessarily consumed due to leakage current.

Another conventional device is described in Japanese Patent Publication No. 7-192979. The device comprises a bonding determination unit, an ID code-setting unit and an ID code resistor for assigning an ID code for product classification. The device has a large size due to an increase in the number of resistors for storing ID codes.

SUMMARY OF THE INVENTION

To solve the above problems, it is an object of the present invention to provide an apparatus for recognizing chip identification (ID) capable of minimizing the number of test pads for ID recognition and recording many pieces of information on the chip ID by employing a simple circuit structure.

It is another object of the present invention to provide a semiconductor device comprising a circuit for recognizing chip identification (ID) capable of minimizing the number of test pads for ID recognition and recording many pieces of information on the chip ID by employing a simple circuit structure.

According to one aspect of the present invention, there is provided an apparatus for recognizing chip identification comprising a counter circuit for counting a clock signal in response to a reset signal and decoding the counted clock signal to produce at least one decoding signal; and a fuse circuit comprising a plurality of fuse arrays, each fuse of the plurality of fuse arrays representing chip identification information, for outputting an output signal indicating whether each fuse of the plurality of fuse arrays is cut in response to the at least one decoding signal.

In a preferred embodiment of the present invention, the counter circuit a counting device comprising N flip-flops (N>1) for counting the clock signal in response to the reset signal and outputting N-bit signals, wherein each flip-flop is connected to each other in series; and a first decoder for combining the bits of the N-bit signals and decoding the combined bits to output the decoded bits as first decoding signals of M-bit; and a second decoder for combining the other bits of the N bit signals and decoding the combined bits to output the decoded bits as second decoding signals of K-bit.

In a preferred embodiment of the present invention, the plurality of fuse arrays comprises K fuse arrays, and each fuse array comprises M fuses. The fuse circuit further comprises a first group of transistors for responding to the first decoding signals, wherein each transistor comprises one end connected a first end of the each fuse; a second group of transistors for responding to the second decoding signals, wherein each transistor is connected between a power voltage and a second end of the each fuse; a pull down transistor connected to the other end of each transistor of the first group of transistors, and for controlling the output signal depending on the power voltage.

According to another aspect of the present invention, there is provided a semiconductor device comprising a plurality of pads for inputting/outputting predetermined signals to an inner circuit during normal operation; a first pad for receiving a reset signal during a test mode for recognizing chip identification; a second pad for receiving a clock signal during the test mode; a circuit for recognizing the chip identification comprising a plurality of fuses for representing chip identification information, for producing an output signal indicating whether each fuse of the plurality of fuses is cut in response to the reset and clock signals; and a third pad for transmitting the output signal of the circuit for recognizing the chip identification information to an external during the test mode.

According to further aspect of the present invention, there is provided a semiconductor device comprising first common pads for inputting predetermined signals during normal operation mode and inputting a reset signal and a clock signal during a test mode for recognizing chip identification; a test pad for inputting an external mode set signal, the mode set signal being enabled during the test mode; a circuit for recognizing the chip identification comprising a plurality of fuses for representing chip identification information, for producing an output signal indicating whether each fuse of the plurality of fuses is cut in response to the reset signal and the clock signal; and a second common pad for transmitting an output signal of an inner circuit to an external during the normal operation mode and transmitting the output signal of the circuit for recognizing the chip identification to the external during the test mode.

BRIEF DESCRIPTION OF THE DRAWINGS

The above objects and advantages of the present invention will become more apparent by describing in detail preferred embodiments thereof with reference to the attached drawings in which:

FIG. 8 is a diagram illustrating input and output signals of a first decoder of FIG. 7;

FIG. 9 is a diagram illustrating input and output signals of a second decoder of FIG. 4;

DETAILED DESCRIPTION OF THE INVENTION

Figure 1:
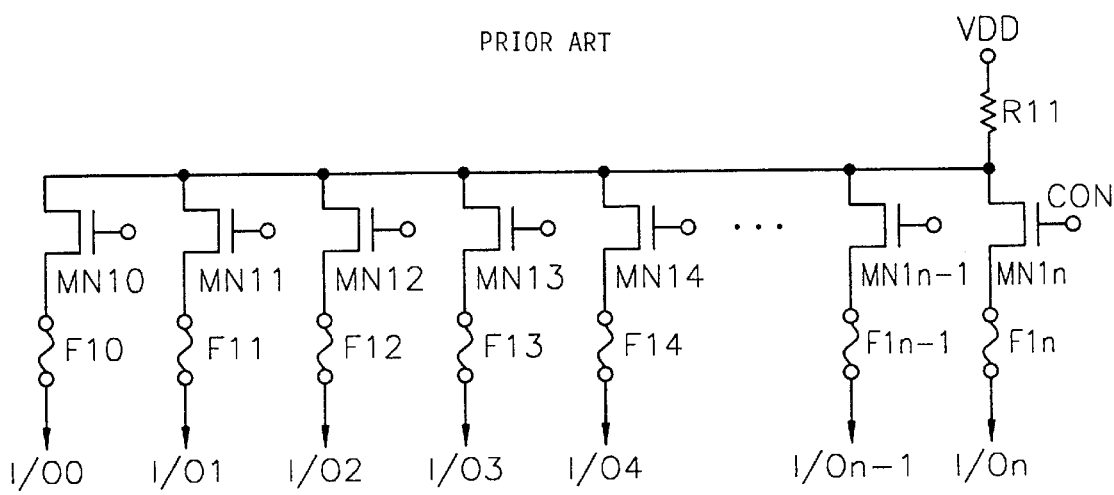
FIG. 1 is a circuit diagram illustrating a conventional chip identification (ID) recognition apparatus.
Figure 2:
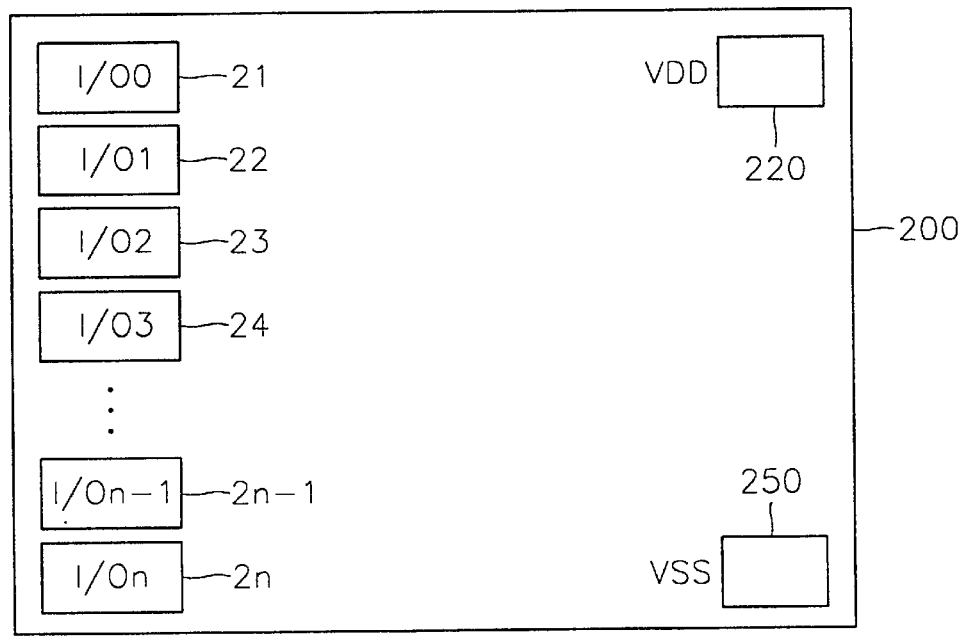
FIG. 2 is a diagram illustrating the pad arrangement of a conventional semiconductor device having the apparatus of FIG. 1.
Figure 3:
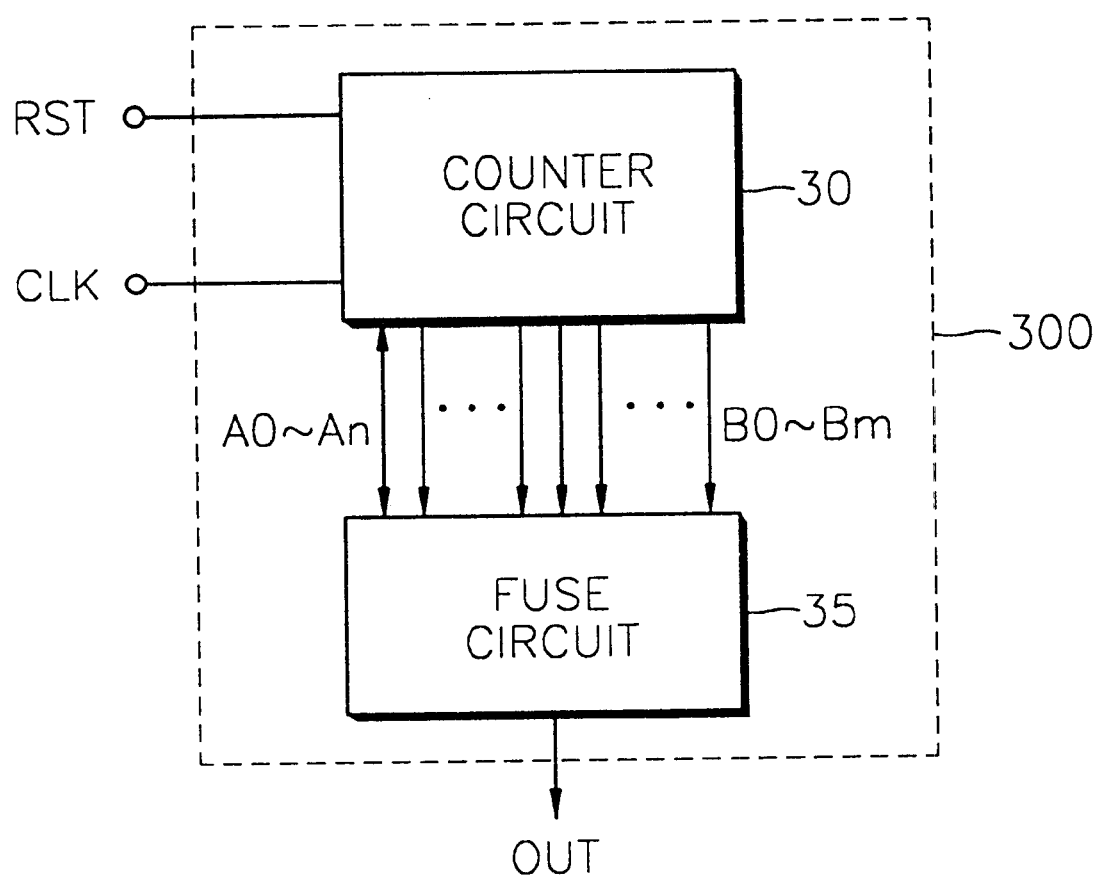
FIG. 3 is a block diagram illustrating a chip ID recognition apparatus according to an embodiment of the present invention.

Referring to FIG. 3, a chip ID recognition apparatus 300 according to an embodiment of the present invention comprises a counter circuit 30 and a fuse circuit 35. The counter circuit 30 counts a clock signal CLK in response to an external reset signal RST and decodes output bits of the counted clock signal into a predetermined bit unit to output first decoding signals AO through An and second decoding signals B0 through Bm, respectively.

The fuse circuit 35 comprises a plurality of fuses for storing various pieces of information, and generates an output signal OUT for determining whether fuses of the plurality of fuses are cut, in response to the first decoding signals A0 through An and the second decoding signals B0 through Bm. Because a chip ID recognition apparatus according to an embodiment of the present invention needs input terminals (which receive the reset signal RST and the clock signal CLK) and output terminals (which transmit the output signal OUT), the number of input terminals and the number of output terminals are the same as the number of pads for a chip ID test. Thus, a chip ID recognition apparatus according to the present invention minimizes the number of pads more significantly compared to a conventional chip ID recognition apparatus.

Figure 4:
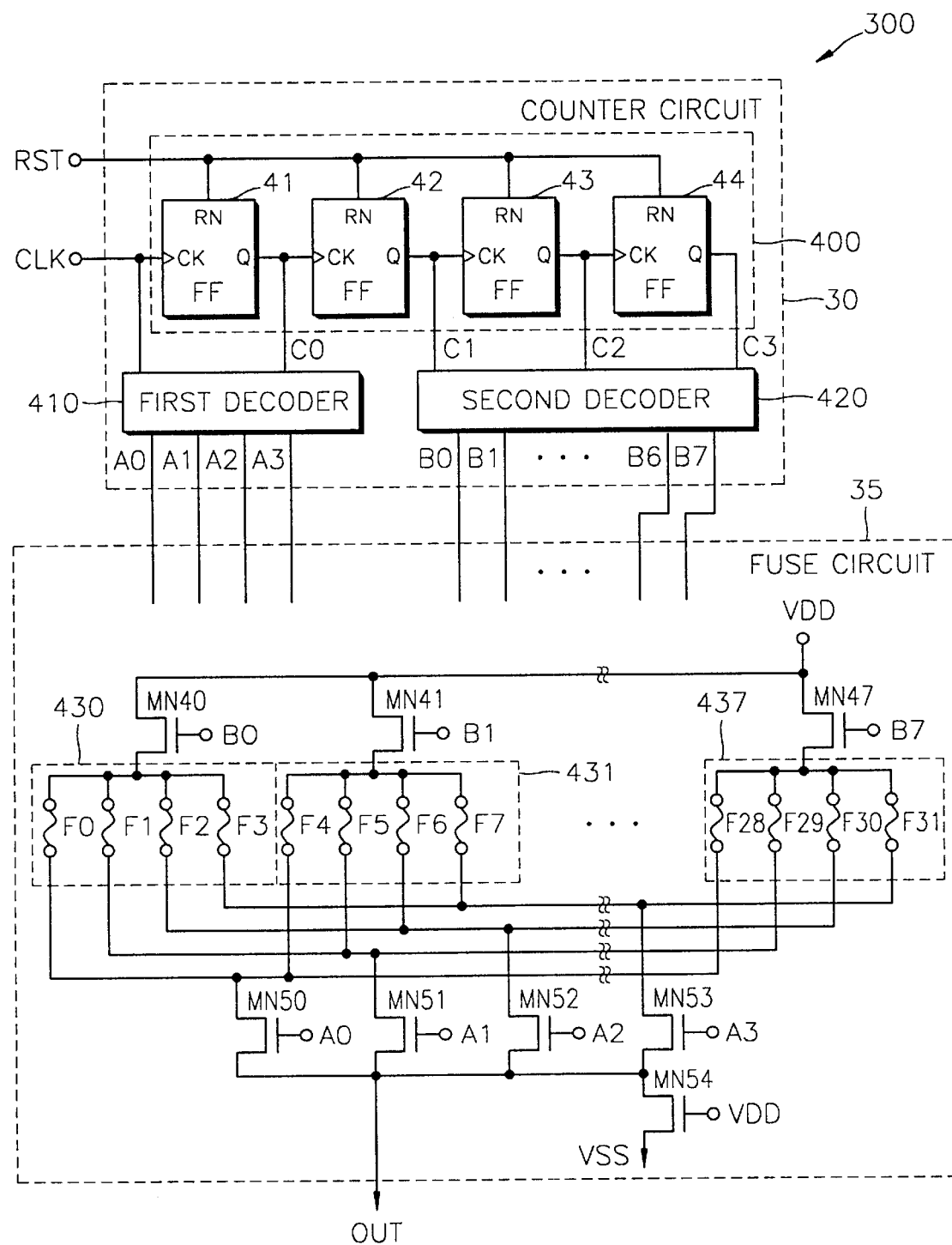
FIG. 4 is a schematic diagram illustrating a chip ID recognition apparatus according to an embodiment of the present invention.

FIG. 4 is a circuit diagram illustrating a chip ID recognition apparatus 300 of FIG. 3. Referring to FIG. 4, a counter circuit 30 comprises a counter 400, a first decoder 410 and a second decoder 420.

The counter 400 comprises a plurality of flip-flops 41 through 44, connected to each other in series, for counting a clock signal CLK after reset by the reset signal RST. For example, a clock signal CLK is applied to the flip-flop 41 and an output signal C0 of the flip-flop 41 is applied to the flip-flop 42. The outputs of the flip-flops 41 through 44 are output bits C0 through C3 of the counter 400. Although the counter 400 is described to comprise four flip-flops in FIG. 4, the number of flip-flops can be varied depending on the manner of design. The counter 400 outputs five bits comprising four output bits C0 through C3 from the four flip-flops 41 through 44 and one bit of the clock signal CLK. However, the counter 400 may not output the clock signal CLK depending on the type of counter.

The first decoder 410 decodes the clock signal CLK and a first output bit of the counter 400, that is, the output bit C0 of the flip-flop 41 to output first decoding signals A0 through A3 of four-bit. The second decoder 420 decodes a second bit C1 to a fourth bit C3 of the counter 400 to output second decoding signals B0 through B7 of eight-bit. The first decoding signals A0 through A3 and the second decoding signals B0 through B7 are control signals for controlling the fuse circuit 35.

In FIG. 4, the counter circuit 30 is described to comprise the two decoders 410 and 420, but the number of decoders may be varied. In other words, the counter circuit 30 may have only one decoder or three or more decoders depending on the number of bits of desired information. However, a counter circuit 30 comprising two decoders is described in embodiments shown in FIGS. 4 through 12.

Referring to FIG. 4 again, the fuse circuit 35 comprises a plurality of NMOS transistors MN40 through MN 47, a plurality of fuse arrays 430 through 437, a plurality of transistors MN50 through MN 53 and a pull down transistor MN54. Specifically, the drains of the NMOS transistors MN40 through MN47 are connected to a power voltage VDD and the gates of the NMOS transistors MN40 through MN47 are connected to the second decoding signals B0 through B7, respectively. Also, the sources of the NMOS transistors MN40 through MN47 are connected to one side of the fuse arrays 430 through 437, respectively. The NMOS transistors MN40 through MN47 are turned on/off by the second decoding signals B0 through B7, respectively. If one of the NMOS transistors MN40 through MN47 is turned on and a fuse connected with the turned-on NMOS transistor is not cut, a current path is formed between the power voltage VDD and the fuse.

Each of the fuse arrays 430 through 437 preferably comprises four fuses connected to each other in serial, and the fuse arrays 430 through 437 are connected to the sources of the NMOS transistors MN40 through MN47, respectively. For example, the fuse array 430 comprises four fuses F0 through F3, in which one end of each fuse is connected to the source of the NMOS transistor MN40 and the other end of each fuse is connected to the drains of the NMOS transistors MN50 through MN53, respectively. The fuse array 431 also comprises four fuses F4 through F7 in which one end of each fuse is connected to the source of the NMOS transistor MN41 and the other end of each fuse is connected to the drains of the NMOS transistors MN50 through MN53. The other fuse arrays 432 through 437 comprise the same structure as the two fuse arrays 430 and 431. The drains of the NMOS transistors MN50 through MN53 are connected to the other ends of four fuses of the fuse arrays 430 through 437, respectively, the gates of the NMOS transistors MN50 through MN53 are connected to the first decoding signals A0 through A3, respectively, and the source s of the NMOS transistors MN50 through MN53 are connected to the output terminal OUT.

In other words, the NMOS transistors MN50 through MN53 are turned on/off by the first decoding signals A0 through A3. If one of the NMOS transistors MN50 through MN53 is turned on, a current path is formed from the power voltage VDD to the output terminal by one of the uncut fuses connected to the turned-on transistor. The pull down transistor MN54 comprises a drain connected to the source of each of the NMOS transistors MN50 through Mn53, a gate connected to the power voltage VDD and a source connected to a ground voltage VSS. If a selected fuse (which is connected to a turned-on transistor) is cut, the pull down transistor MN54 pulls down the output terminal OUT. The fuse circuit 35 indicates various pieces of information on chip ID by the cutting/non-cutting of a particular fuse.

Figure 5:
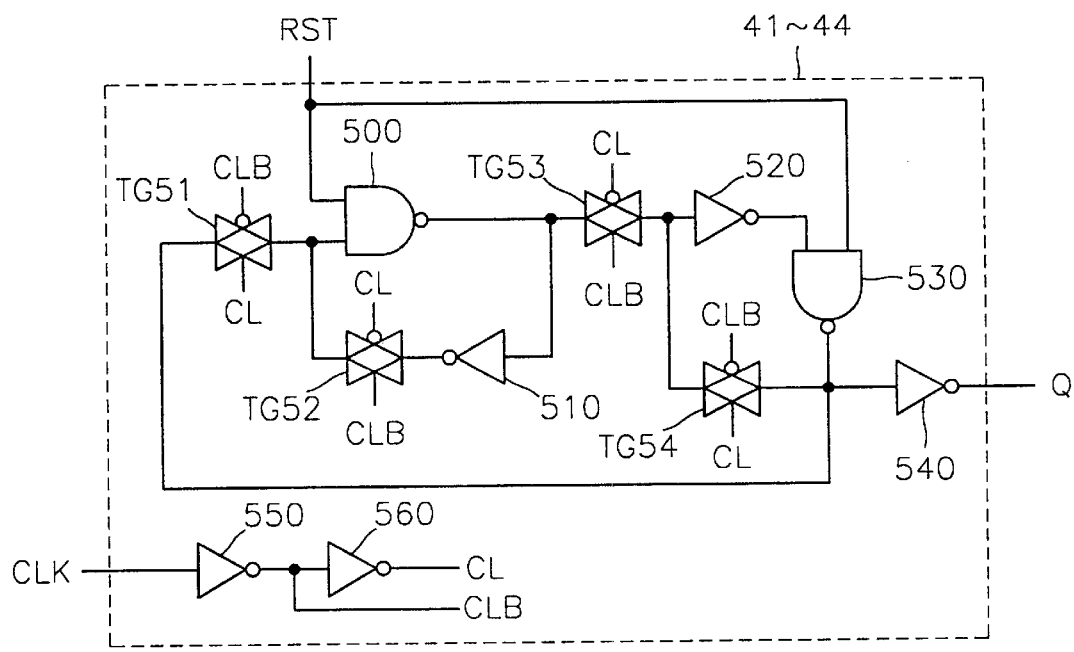
FIG. 5 is a schematic diagram of a flip-flop configuration used in a counter circuit of FIG. 4.

FIG. 5 is a circuit diagram of a flip-flop of the counter 400 of FIG. 4. Referring to FIG. 5, each of flip-flops 41 through 44 comprises transmission gates TG51 through TG54, NAND gates 500 and 530 and inverters 510, 520, 540, 550 and 560.

For example, with the flip-flop 41, a clock signal CLK is delayed by the inverter 550 to produce a second control signal CLB, and then the delayed signal is delayed by the inverter 560 to produce a first control signal CL. For example, with the flip-flops 42 through 44, the output bits C0 through C2 of the counter 400 are delayed to produce the first and second control signals CL and CLB. Each of the transmission gates TG51 through TG54 transmits an input signal in response to transmission control signals, i.e., the first and second control signals CL and CLB.

The NAND gate 500 performs an inverted logical AND operation of a reset signal RST and an output signal of the transmission gate TG51 to output the inverted logical AND operation. The inverter 510 inverts the output signal of the NAND gate 500 and applies the inverted result to the transmission gate TG52 as an input signal. The transmission gate TG52 applies the output signal of the inverter 510 to the NAND gate 500 as an input signal when the first control signal CL has a low level. The transmission gate TG53 applies the output signal of the NAND gate 500 to the inverter 520 when the first control signal CL has a low level.

The NAND gate 530 performs an inverted logical AND operation of the output signal of the inverter 520 and the reset signal RST, the results are inverted at the inverter 540, and the inverter 540 outputs an output signal Q. Also, when the first control signal CL has a high level, the transmission gate TG54 feeds back the output signal to the inverter 520, and the transmission gate TG51 feeds back the output signal of the NAND gate 530 to the NAND gate 500.

FIGS. 6(a) through 6(g) are diagrams illustrating operational waveforms of the flip-flop of FIG. 5. Specifically, FIG. 6(a) shows operational stages of the flip-flop circuit. FIGS. 6(b) through 6(g) show the operational waveforms of the reset signal RST, the clock signal CLK, and the output bits C0 through C3 of the counter 400, respectively.

Figure 6:
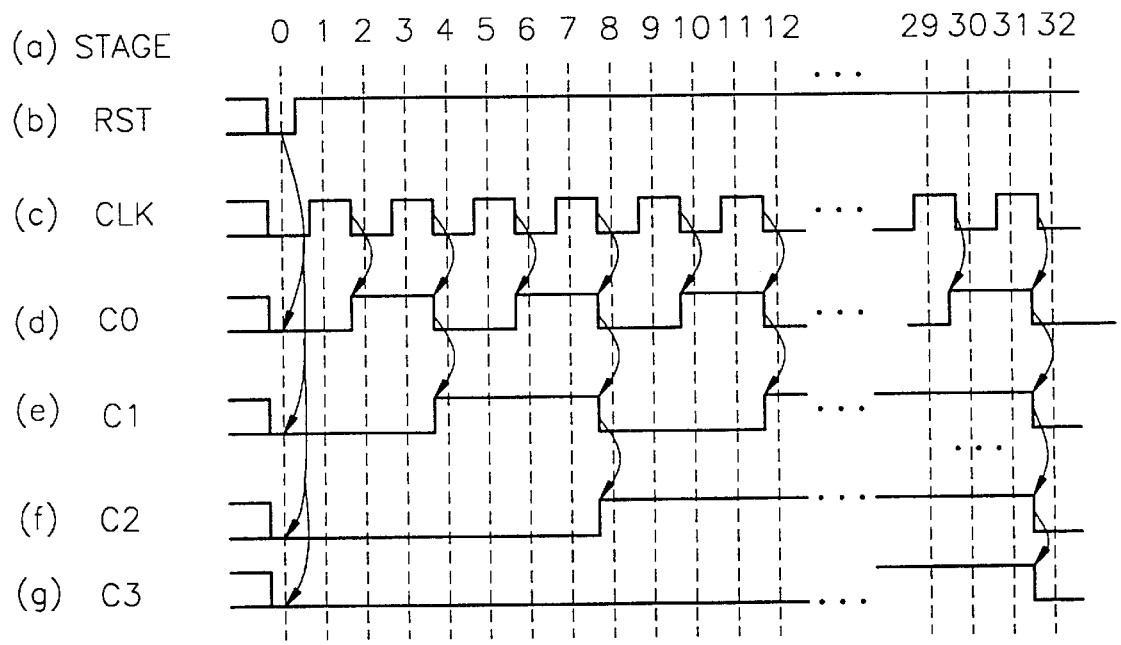
FIGS. 6A through 6G are diagrams illustrating timing waveforms of a counter circuit of FIG. 4.

Referring to FIGS. 4 through 6, an operation of a counter according to an embodiment of the present invention will be described hereinafter. When the flip-flops 41 through 44 are reset by the reset signal RST (STAGE 0), that is, the reset signal RST becomes a low level, the output signals C0 through C3 of the flip-flops 41 through 44 are initialized to have a low level irrespective of the state of the clock signal CLK (FIGS. 6(d) through 6(g)), and the clock signal CLK has a low level. Thus, five bit signals (which comprise the clock signal CLK and the output bits C0 through C3) become "00000" and are inputted into the first and second decoders 410 and 420.

When both the reset signal RST and the clock signal CLK become high levels (STAGE 1), that is, the clock signal CLK is enabled to a high level by the high level of the reset signal RST, the transmission gates TG51 and TG54 are turned on and apply the output signal of the NAND gate 530 to the NAND gate 500 and the inverter 520 as input signals. At this time, the output of the NAND gate 530 shown in FIG. 5 remains a high level and thus, the output signal Q is still at a low level. In other words, as illustrated in FIGS. 6(d) through 6(g), the output bits C0 through C3 of the flip-flops 41 through 44 are not changed at the STAGE 1. Accordingly, the five bits signal C3, C2, C1, C0 and CLK inputted into the first and second decoders 410 and 420 show "00001".

When the clock signal CLK transits from a high level to a low level (STAGE 2), the output signal Q (C0) of the flip-flop 41 is inverted. Specifically, if the clock signal CLK transits from a high level to a low level, the transmission gates TG52 and TG53 are turned on and then, a low level signal output from the NAND gate 500 is transmitted to the inverter 520 via the transmission gate TG53. Thus, the output of the NAND gate 530 becomes a low level, and, as shown in FIG. 6(d), the signal Q (C0) (which is output through the inverter 540) becomes a high level. At this time, the output bits of the other flip-flops 42 through 44 are not changed. Thus, the five bit signals have "00010" and are inputted into the two decoders 410 and 420. Here, the five bit signals applied to the first and second decoders 410 and 420 represent the number of clock signals CLK sequentially applied to the decoders.

When the clock signal CLK and the output bit C0 are at a high level (STAGE 3), a signal "00011" is outputted to the first and second decoders 410 and 420. Also, when the clock signal CLK transits from a high level to a low level (STAGE 4), the output signal Q (C0) of the flip-flop 41 becomes a low level and the output bit C1 becomes a high level. Thus, the signal "00100" is applied to the decoders 410 and 420 at the STAGE 4. As a result, output bits C0 through C3 are combined to produce different bit combinations through the above processes. In other words, if the clock signal CLK is toggled, 32 signals of "00000" through "11111" are sequentially inputted into the first and second decoders 410 and 420. Although flip-flops according to the present invention are described using FIGS. 4 and 5, the flip-flops may be embodied by various circuits.

Figure 7:
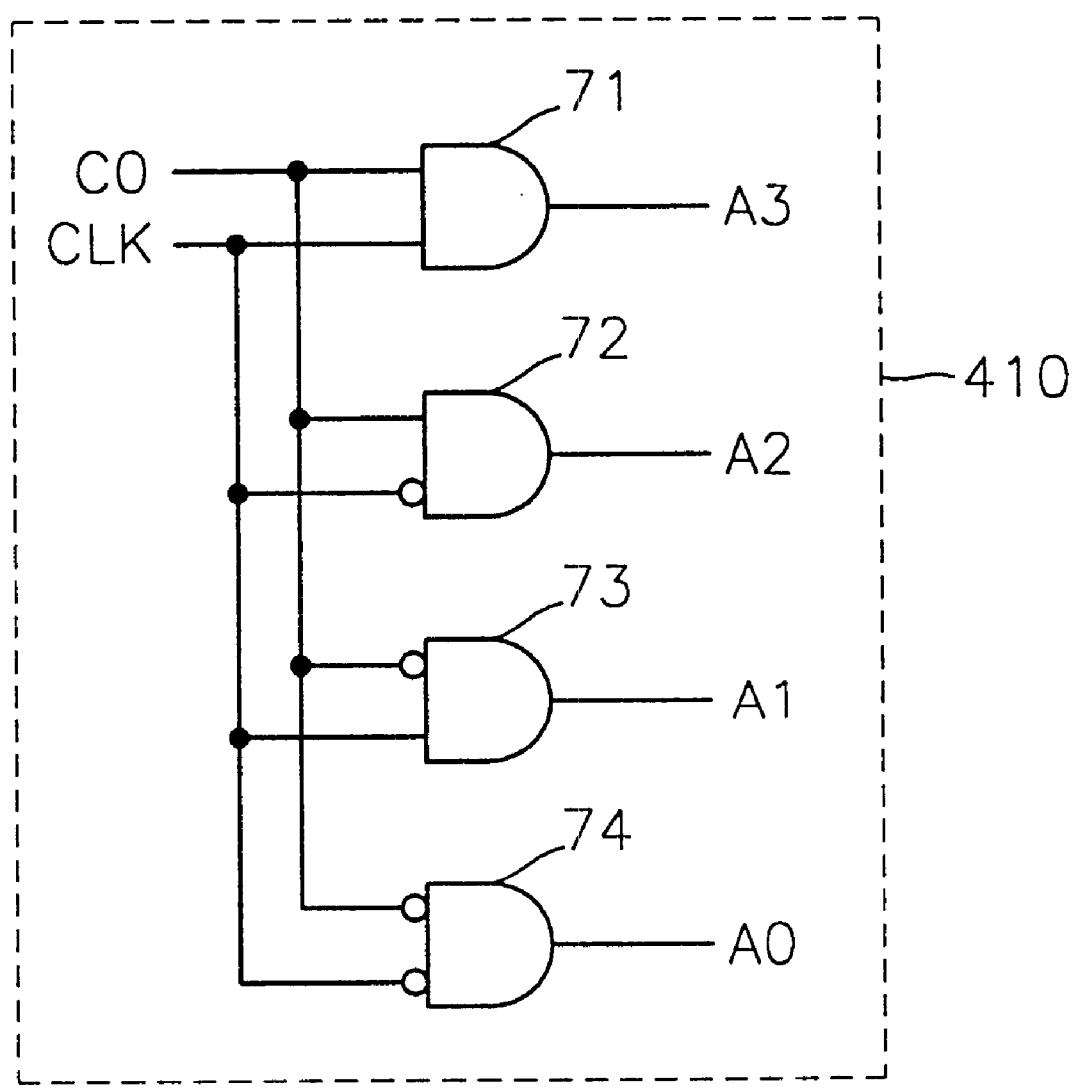
FIG. 7 is a circuit diagram illustrating a first decoder circuit of FIG. 4.

FIG. 7 is a circuit diagram illustrating the first decoder 410 of FIG. 4. Referring to FIG. 7, the first decoder 410 comprises a plurality of AND gates 71 through 74. The AND gate 71 performs a logical AND operation of the output bit C0 of the counter 400 and the clock signal CLK to output the results as an upper bit A3 of the first decoding signals. The AND gate 72 performs a logical AND operation of the output bit C0 of the counter 400 and an inverted signal of the clock signal CLK to output the results as A2 of the first decoding signals. The AND gate 73 performs a logical AND operation of an inverted signal of the output bit C0 and the clock signal CLK and then outputs A1 of the first decoding signals. The AND gate 74 performs a logical AND operation of the inverted signal of the output bit C0 and the inverted signal of the clock signal CLK to output the results as a least significant bit (LSB) A0 of the first decoding signals.

FIG. 8 is a diagram illustrating the input signals C0 and CLK and the output signals A0 through A3 of the first decoder shown in FIG. 7. Referring to FIGS. 7 and 8, if the input signals C0 and CLK are "1", the output signal A3 becomes a high level and the output signals A0 through A2 become a low level. If the input signal C0 is "1" and the other input signal CLK is "0", the output signal A2 becomes a high level and the input signals A0, A1 and A3 become a low level. If the input signal C0 is "0" and the output signal CLK is "1", the output signal A1 becomes a high level and the input signals A0, A2 and A3 become a low level. Also, if the input signals C0 and CLK are "0", the output signal A0 becomes a high level and the input signals A1 through A3 become a low level.

The second decoder 420 of FIG. 4 (which receive the output bits of C1 through C3 as input signals to output second decoding signals B0 through B7) can be realized in the same manner as the first decoder 410 of FIG. 7. In other words, the second decoder 420 may produce the second decoding signals B0 through B7 by using eight AND gates for performing logical AND operations on the three bits C1 through C3, respectively.

FIG. 9 is a diagram illustrating the input signals C1 through C3 and output signals B0 through B7 of the second decoder 420 of the counter circuit 30 shown in FIG. 4. Referring to FIG. 9, the second decoding signals B0 through B7 (which is made by combining the three bits C1 through C3) have only one high level bit and seven low level bits. For example, if the input signals C1 through C3 are "0", only the second decoding signal B0 becomes a high level and the others become low levels. If the input signal C1 is "1" and the input signals C2 and C3 are "0", the second decoding signal B1 becomes a high level and the others B0 and B2 through B7 become low levels.

As shown in FIGS. 8 and 9, when the clock signal CLK and the output bits C0 through C3 of the counter 400 are combined and decoded, one bit among the first decoding signals A0 through A3 and one bit among the second decoding signals B0 through B7 become high levels and the other bits become low levels. These first decoding signals A0 through A3 and the second decoding signals B0 through B7 (which are outputted from the counter circuit 30) control the fuse circuit 35 of FIG. 4.

Referring to FIG. 4 again, the operation of the fuse circuit 35 will be described hereinafter. Because the only one of the first decoding signals A0 through A3 of the first decoder 410 is a high level, a high level of voltage is applied to only one of the four NMOS transistors MN50 through MN53. Similar to the first decoding signal, because the only one of the output signals B0 through B7 of the second decoder 420 is a high level, a high level of voltage is applied to only one of the eight NMOS transistors MN40 through MN47. For example, assume that the output signal A0 of the first decoder 410 and the output signal B0 of the second decoder 420 are high levels and the other bits A1 through A3 and B1 through B7 of the first and second decoders 410 and 420 are low levels. At this time, only the fuse F0 of the first fuse array 430 may have influence on the output terminal OUT. If the fuse F0 is cut, output voltage at the output terminal OUT becomes a low level because the NMOS transistor MN54 acts as a pull-down transistor. However, if the fuse F0 is not cut, an output voltage proportional to the ratio of resistance among the transistors MN40, MN50 and MN54 (which turn on) is outputted at the output terminal OUT.

Therefore, the output voltage at the output terminal OUT is less than the power voltage VDD and more than the ground voltage VSS. At this time, if the resistance of the pull down transistor MN54 is increased and the resistance of the NMOS transistors MN40 and MN50 is decreased, the level of the output voltage at the output terminal OUT can be close to the power voltage VDD. Thus, the level of the output terminal OUT can be recognized to be logic "hi".

As described above, a fuse is selected by two high signals of the first and second decoding signals A0 through A3 and B0 through B7 (which control transistor connected to the fuse), and the level of the output voltage at the output terminal OUT is determined by the cutting/non-cutting of the selected fuse. Information about the cutting/non-cutting of the 32 fuses F0 through F31 are output through the output terminal OUT depending on the state of the clock signals CLK that are sequentially input into the apparatus for recognizing chip ID.

Further, the fuse circuit 35 according to the present invention can record a large amount of information on the chip ID using the 32 fuses F0 through F31. For example, the fuse F0 (so called a master fuse) is preferably used for determining whether information is recorded in the fuse circuit 35. Thus, it is determined whether a chip ID recognition apparatus has been used by cutting/non-cutting of the fuse F0. Also, the fuses F1 through F14 are preferably used for recording chip positions on a wafer. Actually, a wafer can have tens through thousands of chips or more. Thus, the fuses F1 through F14 are preferably used for representing the chip positions on a wafer in terms of the X-axis and the Y-axis. For example, seven fuses among the 14 fuses F1 through F14 can be used as indicators of the X-axis and the other fuses can be used as indicators of the Y-axis. In this case, the number of chip positions expressed as the coordinates by the 14 fuses F1 through F14 is $2^{14}$ (i.e., 16384).

For example, the fuses F15 through F19 are preferably used for recording a wafer number. In general, one lot comprises 25 wafers for manufacturing a semiconductor. Thus, if five fuses F15 through F19 are used for recording the number of wafers, 25 wafers can be numbered. For example, the fuses F20 through F30 are preferably used for recording a production lot number. In this case, 211 lots can be numbered. The fuse F31 is preferably used in a parity check for determining whether fuse data is erred. To improve reliability of the fuse data, the fuse F31 is cut to have an even number or an odd number of cut fuses. The manner of utilizing the 32 fuses may be different depending on the purpose of use. For example, the fuses can be used to record ID data about chip grades according to their characteristics or ID data about the management of chips.

According to an embodiment of the present invention, a chip ID recognition apparatus can be comprised in a predetermined position of a semiconductor device after recording a desired chip ID. In addition, information on chip ID can be read from a semiconductor chip after packaging the semiconductor device by using a chip ID recognition apparatus according to an embodiment of the present invention. A method for installing a chip ID recognition apparatus in a semiconductor device can be variously realized and will be detailed hereinafter.

Figure 10:
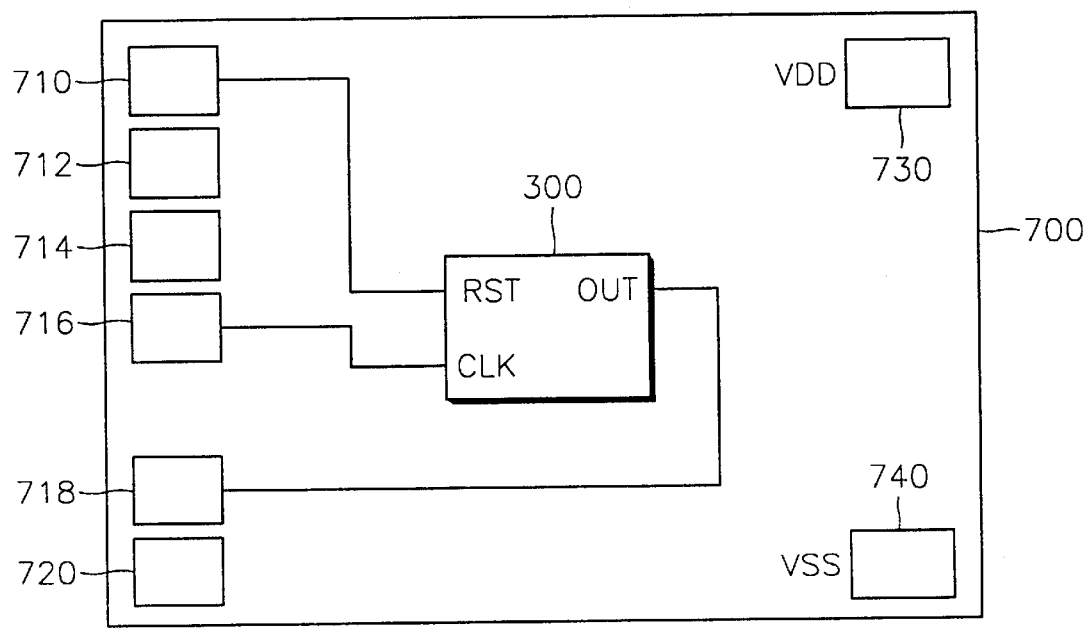
FIG. 10 is a diagram illustrating a semiconductor device comprising a chip ID recognition apparatus according to an embodiment of the present invention.

FIG. 10 is a diagram illustrating a semiconductor device comprising a chip ID recognition apparatus according to an embodiment of the present invention. The semiconductor device 700 comprises a plurality of pads 710 through 720, 730 and 740 and an apparatus of recognizing chip ID 300.

The pads 712, 714 and 720 are used for inputting/outputting predetermined signals to an inner circuit (not shown) in a normal operation. The pad 730 is used for applying a power voltage VDD and the pad 740 is used for applying a ground voltage VSS. The pads 710 and 716 are used for inputting a reset signal RST and a clock signal CLK as input signals to the chip ID recognition apparatus 300. The pad 718 is used for transmitting output OUT of the chip ID recognition apparatus 300 to the outside.

As illustrated in FIG. 10, when the chip ID recognition apparatus 300 is installed in the semiconductor device 700, the three pads 710, 716 and 718 of the plurality of pads are required for testing chip ID. In other words, because only three pads are required to install the apparatus 300 in the device 700 regardless of increasing the number of fuses, the number of pads for recognizing chip ID does not increase. Therefore, even if the amount of information to be recorded increases and the number of fuses increases, the number of pads does not increases. In this case, only the number of the clock signal CLK needs to be increased. In addition, once the apparatus 300 is installed in the semiconductor device 700, a method for testing chip ID maintains consistency irrespective of changing of the information type and the number of cut fuses. Thus, a layout of the chip ID recognition apparatus 300 is always maintained.

Figure 11:
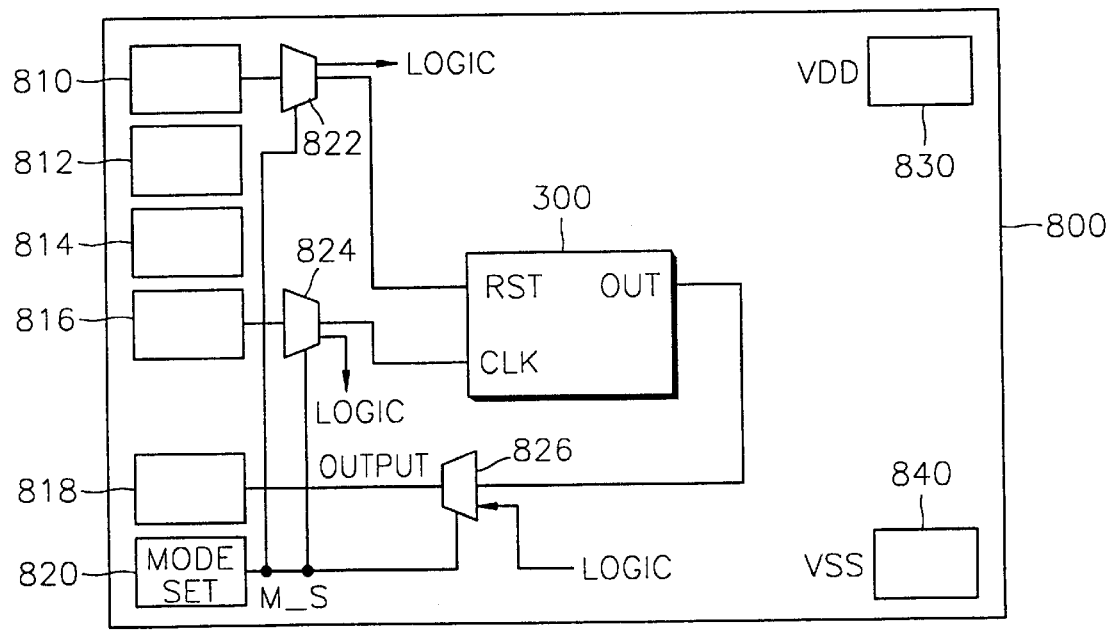
FIG. 11 is a diagram illustrating another semiconductor device comprising a chip ID recognition apparatus according to another embodiment of the present invention.

FIG. 11 is a diagram illustrating another semiconductor device comprising a chip ID recognition apparatus according to the present invention. Referring to FIG. 11, a semiconductor device 800 comprises a plurality of pads 810 through 820, a pad 830 for applying a power voltage VDD, a pad 840 for applying a ground voltage VSS, an apparatus for recognizing chip ID 300 and multiplexers 822, 824 and 826.

The semiconductor device 800 of FIG. 11 uses a method for reducing the number of pads for a chip ID test in installing the apparatus 300. In other words, the pads 810, 816 and 818 are used for inputting a clock signal CLK and a reset signal RST to the apparatus 300 and for outputting an output signal OUT, respectively, as well as for inputting/outputting a signal at a normal operation by using a test pad 820 for receiving a mode set signal M_S.

The multiplexer 822 transmits the reset signal RST for a chip ID recognition test to the chip ID recognition apparatus 300 in response to the mode set signal M_S of the pad 820 or transmits a signal (that is inputted during a normal operation) to an inner circuit (not shown). The multiplexer 824 transmits a signal from the pad 816 to the chip ID recognition apparatus 300 as the clock signal CLK in response to the mode set signal M_S or transmits the signal for a normal operation to the inner circuit (not shown). The multiplexer 826 transmits the output signal OUT of the chip ID recognition apparatus 300 to the pad 818 in response to the mode set signal M_S or an output signal (that is outputted from an inner circuit (not shown) in the normal operation) to the pad 818.

When the mode set signal M_S is enabled, the signals inputted through the pads 810, 816 are applied to the chip ID recognition apparatus 300 as the reset signal RST and the clock signal CLK, respectively. The output signal is outputted from the chip ID recognition apparatus 300 to the outside through the pad 818 in response to the mode set signal M_S.

On the other hand, when the mode set signal M_S is disabled, the signals inputted through the pads 810 and 816 are applied to the inner circuit (not shown) such that the semiconductor device 800 can perform a normal operation. At this time, the output signal of the inner circuit (not shown) is outputted to the outside through the pad 818. In other words, with activation of the mode set signal M_S, the input and output signals (that are used for a normal operation) are blocked and the signals for performing a chip ID recognition test are inputted/outputted to the semiconductor device 800.

As described above, because the semiconductor device 800 of FIG. 11 can multiplex two different signals, i.e., one being inputted during the normal operation and the other being inputted during the test operation in response to the mode set signal M_S, the device 800 can use the same pad to input/output the two different signals.

Figure 12:
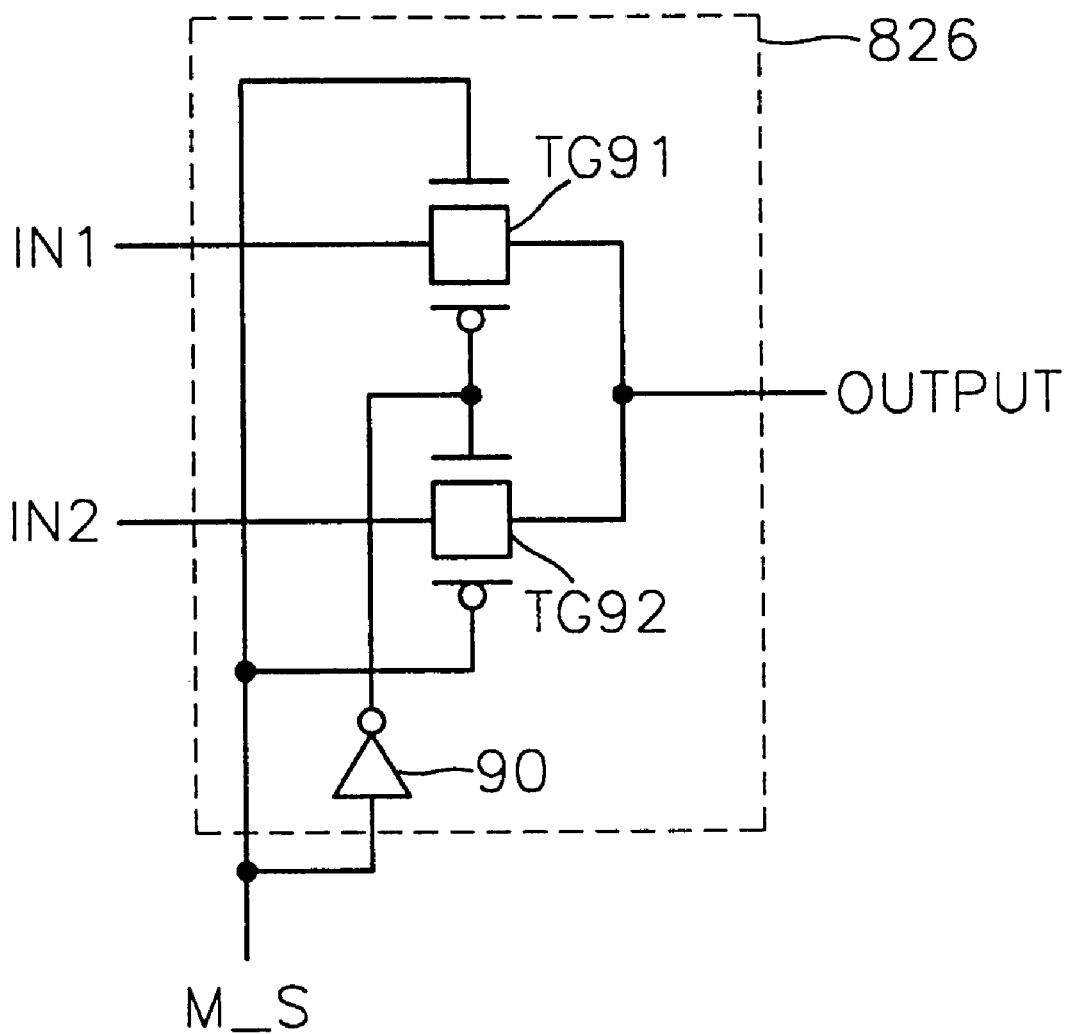
FIG. 12 is a circuit diagram illustrating a multiplexer of a semiconductor device of FIG. 11.

FIG. 12 is a circuit diagram illustrating the multiplexer 826 of the semiconductor device shown in FIG. 11. Referring to FIG. 12, the multiplexer 826 comprises transmission gates TG91 and TG92 and an inverter 90.

The transmission gates TG91 and TG92 receive a mode set signal M_S and an inverted mode set signal inverted by the inverter 90 as transmission control signals, respectively. And, the transmission gates TG91 and TG92 transmit input signals IN1 and IN2 to an output terminal OUTPUT in response to the transmission control signals. Here, the input signal IN1 may become an output signal OUTPUT of the chip ID recognition apparatus 300 and the input signal IN2 may become an output signal of the inner circuit (not shown) of the semiconductor device 800 of FIG. 11.

In other words, if the mode set signal M_S is a high level, the transmission gate TG91 turns on and outputs the input signal IN1 to the output terminal OUTPUT. Also, if the mode set signal M_S is a low level, the transmission gate TG92 turns on and outputs the input signal IN2 to the output terminal OUTPUT.

Although FIG. 12 illustrates the multiplexer 826 connected to the pad 818, it is understood that the other multiplexers 822 and 824 may be embodied in the same way as the multiplexer 826. For example, when embodying the multiplexers 822 and 824, the input signals IN1 and IN2 are replaced by output signals OUT1 and OUT2, respectively, and the output terminal OUTPUT is replaced by an input terminal INPUT. Also, the number of input or output signals or other components may be changed depending on design methods.

A chip ID recognition apparatus according to an embodiment of the present invention can be installed in a semiconductor device with general processes for manufacturing a wafer. Thus, an additional process is not required for installing a chip ID recognition apparatus into a semiconductor device. Only a step for setting the apparatus is added to the general processes for manufacturing a wafer. Specifically, the chip ID recognition apparatus is installed in a semiconductor device in an early stage of the process for manufacturing a wafer (such as a photolithography step, an etching step and a deposition step). After manufacturing a wafer, a probing test for testing a wafer is performed. For example, when a semiconductor chip comprises a memory cell, repair information is extracted for repairing defective memory cells. A repairing process is performed by using a laser beam which cuts fuses corresponding to the defective memory cell blocks. In this process, the fuses of a chip ID recognition apparatus according to an embodiment of the present invention are also cut according to a certain standard. After that, depending on the kind of semiconductor chip, a second wafer probing test or a wafer sawing process and a package assembly process are performed. After a chip ID recognition apparatus is installed in a semiconductor chip through the processes described above, chip ID can be recognized even if the chip is packaged.

While this invention has been particularly shown and described with reference to preferred embodiments thereof, it will understood by those skilled in the art that various changes in form and details may be made therein without departing from the spirit and scope of the invention as defined by the appended claims.

Advantageously, according to an embodiment of the present invention, a chip ID recognition apparatus is capable of minimizing the number of pads of a semiconductor chip and recording many pieces of information on chip ID. Further, the apparatus occupies a smaller portion of a semiconductor device and can be recognized in a packaged state because it can be formed by a counter circuit and a fuse circuit without a large number of resisters. In addition, because a semiconductor device comprising a chip ID recognition apparatus according to an embodiment of the present invention can share pads in a test operation and a normal operation by a multiplexer selecting input and output signals for the apparatus, leakage current caused by a potential difference between the pads and an external electrode can be prevented.

What is claimed is:

1. An apparatus for recognizing chip identification, comprising:
   a counter circuit for counting a clock signal in response to a reset signal and decoding the counted clock signal to produce at least one decoding signal;
   a fuse circuit comprising a plurality of fuse arrays, each fuse of the plurality of fuse arrays representing chip identification information, for outputting an output signal indicating whether each fuse of the plurality of fuse arrays is cut in response to the at least one decoding signal.

2. The apparatus of claim 1, wherein the counter circuit comprises:
   a counting device comprising N flip-flops (N>1) for counting the clock signal in response to the reset signal and outputting N-bit signals, each flip-flop being connected to each other in series; and
   at least one decoder for combining the N-bit signals and decoding the combined signals to output the decoded signals as the at least one decoding signal.

3. The apparatus of claim 1, wherein the counter circuit comprises:
   a counting device comprising N flip-flops (N>1) for counting the clock signal in response to the reset signal and outputting N+1 bit signals, wherein the N+1 bit signals comprises N bits of the counted clock signals and one bit of the clock signal, wherein each flip-flop is connected to each other in series; and
   at least one decoder for combining the bits of the N+1 bit signals and decoding the combined signals to output the decoded signals as the at least one decoding signal.

4. The apparatus of claim 1, wherein the counter circuit comprises:
   a counting device comprising N flip-flops (N>1) for counting the clock signal in response to the reset signal and outputting N-bit signals, each flip-flop being connected to each other in series;
   a first decoder for combining the bits of the N-bit signals and decoding the combined bits to output the decoded bits as first decoding signals of M-bit; and
   a second decoder for combining the other bits of the N bit signals and decoding the combined bits to output the decoded bits as second decoding signals of K-bit.

5. The apparatus of claim 4, wherein the plurality of fuse arrays comprises K fuse arrays, and each fuse array comprises M fuses, wherein the fuse circuit further comprises:
   a first group of transistors for responding to the first decoding signals, wherein each transistor comprises one end connected a first end of the each fuse;
   a second group of transistors for responding to the second decoding signals, wherein each transistor is connected between a power voltage and a second end of the each fuse;
   a pull down transistor connected to the other end of each transistor of the first group of transistors, and for controlling the output signal depending on the power voltage.

6. The apparatus of claim 5, wherein the first group of transistors comprises M transistors, and the second group of transistors comprises K transistors.

7. The apparatus of claim 1, wherein the counter circuit comprises:
   a counting device comprising N flip-flops (N>1) for counting the clock signal in response to the reset signal and outputting N+1 bit signals, wherein the N+1 bit signals comprises N bits of the counted clock signals and one bit of the clock signal, wherein each flip-flop is connected to each other in series; and
   a first decoder for combining the bits of the N-bit signals and decoding the combined bits to output the decoded bits as first decoding signals of M-bit; and
   a second decoder for combining the other bits of the N-bit signals and decoding the combined bits to output the decoded bits as second decoding signals of K-bit.

8. The apparatus of claim 1, wherein the chip identification information of the each fuse comprises chip position on a wafer, wafer number, lot number originally assigned by a manufacturer and information on a parity check.

9. The apparatus of claim 1, wherein the fuse circuit further comprises:
   a first group of transistors connected to each fuse of the plurality of fuse arrays, respectively;
   a second group of transistors connected to each fuse array of the plurality of fuse arrays, respectively;
   a pull down transistor connected to the first group of transistors, and for controlling the output signal depending on a power voltage;
   wherein the output signal is produced by the first and second group of transistors in response to the at least one decoding signal.

10. A semiconductor device comprising:
   a plurality of pads for inputting/outputting predetermined signals to an inner circuit during normal operation;

a first pad for receiving a reset signal during a test mode for recognizing chip identification;

a second pad for receiving a clock signal during the test mode;

a circuit for recognizing the chip identification comprising a plurality of fuses for representing chip identification information, for producing an output signal indicating whether each fuse of the plurality of fuses is cut in response to the reset and clock signals; and a third pad for transmitting the output signal of the circuit for recognizing the chip identification to an external during the test mode.

11. The semiconductor device of claim 10, wherein the circuit for recognizing the chip identification further comprises:

a counter circuit for counting the clock signal in response to the reset signal during the test mode and decoding the counted clock signal to output at least one decoding signal; and a fuse circuit having the plurality of fuses for outputting the output signal in response to the at least one decoding signal.

12. A semiconductor device comprising:

first common pads for inputting predetermined signals during normal operation mode and inputting a reset signal and a clock signal during a test mode for recognizing chip identification;

a test pad for inputting an external mode set signal, the mode set signal being enabled during the test mode;

a circuit for recognizing the chip identification comprising a plurality of fuses for representing chip identification information, for producing an output signal indicating whether each fuse of the plurality of fuses is cut in response to the reset signal and the clock signal; and a second common pad for transmitting an output signal of an inner circuit to an external during the normal operation mode and transmitting the output signal of the circuit for recognizing the chip identification to the external during the test mode.

13. The semiconductor device of claim 12, wherein the circuit for recognizing the chip identification further comprises:

a counter circuit for counting the clock signal in response to the reset signal during the test mode and decoding the counted clock signal to output at least one decoding signal; and a fuse circuit having the plurality of fuses for outputting the output signal in response to the at least one decoding signal.

14. The semiconductor device of claim 12, further comprising:

a first multiplexer for applying a signal from the first common pads to the inner circuit or to the circuit for recognizing the chip identification in response to the mode set signal; and a second multiplexer for applying the output signal of the inner circuit or the output signal of the circuit for recognizing the chip identification to the second common pad in response to the mode set signal.

* * * * *